(12) United States Patent
Shimizu et al.

(10) Patent No.: US 8,325,537 B2
(45) Date of Patent: Dec. 4, 2012

(54) MODE REGISTER OUTPUT CIRCUIT

(75) Inventors: Atsushi Shimizu, Chuo-ku (JP);
Takahiko Fukiage, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 392 days.

(21) Appl. No.: 12/700,121

(22) Filed: Feb. 4, 2010

(65) Prior Publication Data

US 2010/0195413 A1    Aug. 5, 2010

(30) Foreign Application Priority Data

Feb. 5, 2009    (JP) ................................. 2009-024451

(51) Int. Cl.
*G11C 7/10*    (2006.01)
(52) U.S. Cl. .................. 365/189.05; 365/149; 365/219; 365/233.13
(58) Field of Classification Search .................. None
See application file for complete search history.

(56) References Cited

U.S. PATENT DOCUMENTS

| | | | | |
|---|---|---|---|---|
| 5,699,302 A | * | 12/1997 | Shinozaki et al. | 365/189.05 |
| 5,973,988 A | * | 10/1999 | Nakahira et al. | 365/49.17 |
| 7,478,208 B2 | * | 1/2009 | Kim et al. | 711/154 |
| 7,610,455 B2 | * | 10/2009 | Oh | 711/156 |
| 8,031,534 B2 | * | 10/2011 | Lee | 365/189.05 |
| 8,154,933 B2 | * | 4/2012 | Lee | 365/189.05 |

FOREIGN PATENT DOCUMENTS

JP    09-259582 A    10/1997

OTHER PUBLICATIONS

JESD209-2A, "Low Power Double Data Rate 2 (LPDDR2)," Oct. 2009, JEDEC. 232 pages.*
Athavale et al., "High-Speed Serial I/O Made Simple: A Designers Guide, with FPGA Applications," Apr. 2005, XILINX. Editiona 1.0. Selected excerpts. 8 pages.*

* cited by examiner

*Primary Examiner* — Alexander Sofocleous
(74) *Attorney, Agent, or Firm* — Sughrue Mion, PLLC

(57) ABSTRACT

To provide a semiconductor memory device including a mode register in which a mode signal is set, a data amplifier that amplifies read data read from a memory cell array, a data bus onto which the read data amplified by the data amplifier is transmitted, a data input/output circuit that outputs a signal on the data bus to outside, and a mode signal output circuit that outputs the mode signal set in the mode register onto the data bus. Because the mode signal is not caused to interrupt halfway along the data input/output circuit, but supplied onto the data bus that connects the data amplifier to the data input/output circuit, no collision of the read data with the mode signal occurs in the data input/output circuit.

10 Claims, 9 Drawing Sheets

MODE REGISTER OUTPUT CIRCUIT

BACKGROUND OF THE INVENTION

1. Field of the Invention

The present invention relates to a semiconductor memory device, and more particularly relates to a semiconductor memory device that can output a mode signal set in a mode register to outside.

2. Description of Related Art

Various types of operation modes are prepared in many semiconductor memory devices. A specific operation mode can be selected among the prepared operation modes by setting a predetermined mode signal in a mode register.

A mode signal set in a mode register can be read by issuing a mode register read command (MRR command) from outside (see Japanese Patent Application Laid-Open No. 9-259582). However, in conventional semiconductor memory devices, differently from ordinary data reading, the mode signal read from the mode register is supplied onto a signal path in a data input/output circuit in a manner in which the mode signal intervenes in the data input/output circuit. Therefore, when the mode register read command is issued right after a read command, read data flowing in the data input/output circuit collides with the mode signal read from the mode register.

For this reason, it is necessary to wait for a predetermined time period after issuing the read command so as to prevent such data collision. This means that it is necessary to handle the mode register read command as an exception in regard of minimum issuance intervals of issuing continuous commands (CAS to CAS delay). This leads to a problem that controller-side control is complicated.

Therefore, under these circumstances, it has been desired to provide a semiconductor memory device capable of preventing collision of read data with a mode signal in a data input/output circuit, even when a read command and a mode register read command are continuously issued at minimum issuance intervals.

SUMMARY

In one embodiment, there is provided a semiconductor memory device that includes a mode register in which a mode signal indicating an operation mode is set, a memory cell array that includes a plurality of memory cells, a data amplifier that amplifies read data read from the memory cell array, a data bus onto which the read data amplified by the data amplifier is transmitted, a data input/output circuit that outputs a signal on the data bus to outside, and a mode signal output circuit that outputs the mode signal set in the mode register onto the data bus.

According to the present invention, the mode signal read from the mode register does not intervene in the data input/output circuit, but supplied onto the data bus that connects the data amplifier to the data input/output circuit. Therefore, even when the read command and the mode register read command are continuously issued at minimum issuance intervals, the read data does not collide with the mode signal in the data input/output circuit. Accordingly, a controller that controls the semiconductor memory device according to the present invention can handle the mode register read command similarly to ordinary read commands, thereby facilitating controller-side control.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
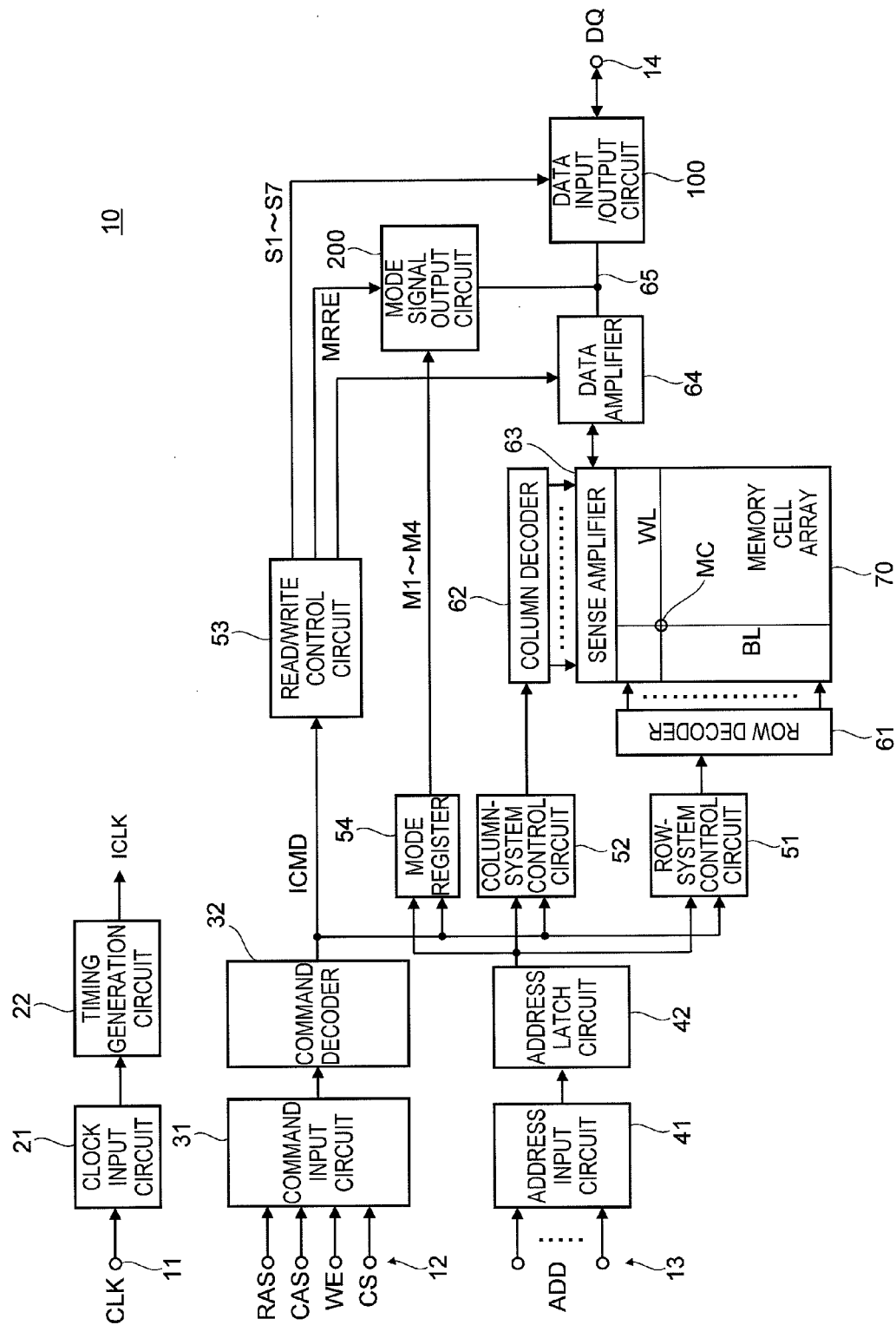
FIG. 1 is a block diagram showing a configuration of a semiconductor memory device according to an embodiment of the present invention.

FIG. 1 is a block diagram showing a configuration of a semiconductor memory device 10 according to an embodiment of the present invention.

The semiconductor memory device 10 according to the present embodiment is a synchronous DRAM and includes a clock terminal 11, a command terminal 12, an address terminal 13, and a data input/output terminal 14 as external terminals.

The clock terminal 11 is provided with a clock signal CLK, and the clock signal CLK is supplied to a clock input circuit 21. An output from the clock input circuit 21 is supplied to a timing generation circuit 22. The timing generation circuit 22 generates an internal clock ICLK and supplies the generated internal clock ICLK to various internal circuits to be described later.

The command terminal 12 is provided with command signals such as a row address strobe signal RAS, a column address strobe signal CAS, a write enable signal WE, and a chip selection signal CS. These command signals are supplied to a command input circuit 31. These command signals supplied to the command input circuit 31 are supplied to a command decoder 32. The command decoder 32 holds, decodes and counts each command signal synchronously with the internal clock ICLK, thereby generating an internal command ICMD of a type corresponding to the command signal. The generated internal command ICMD is supplied to a row-system control circuit 51, a column-system control circuit 52, a read/write control circuit 53, and a mode register 54.

The mode register 54 is set operation modes of the semiconductor memory device 10 according to the present embodiment. For example, a mode signal set in the mode register 54 defines latency, a clock frequency and the like during a normal operation. Furthermore, the mode signal set in the mode register 54 allows the semiconductor memory device 10 to enter a test mode or the like.

The address terminal 13 is provided with address signals ADDs, and the supplied address signals ADDs are supplied to an address input circuit 41. An output from the address input circuit 41 is supplied to an address latch circuit 42. The address latch circuit 42 latches each of the address signals ADD synchronously with the internal clock ICLK. Among the address signals ADDs latched by the address latch circuit 42, a row address is supplied to the row-system control circuit 51 and a column address is supplied to the column-system control circuit 52. Furthermore, when the semiconductor memory device 10 enters a mode register set mode, the address signals ADDs are supplied to the mode register 54.

An output from the row-system control circuit 51 is supplied to a row decoder 61. The row decoder 61 selects one of word lines WLs included in a memory cell array 70. In the memory cell array 70, a plurality of the word lines WLs and a plurality of bit lines BL intersect with one another and memory cells MCs are arranged at respective intersecting points (FIG. 1 shows only one word line WL, one bit line BL, and one memory cell MC). The bit lines BLs are connected to corresponding sense amplifiers 63, respectively. An output from the column-system control circuit 52 is supplied to a column decoder 62. The column decoder 62 selects one of the sense amplifiers 63 included in the memory cell array 70.

The sense amplifier 63 selected by the column decoder 62 is connected to a data amplifier 64. The data amplifier further amplifiers read data amplified by the sense amplifier 63 during a read operation, and outputs further the amplified read data onto a data bus 65. Meanwhile, during a write operation, the data amplifier 64 amplifies write data transmitted via the data bus 65 and supplies the amplified write data to the sense amplifier 63. The read/write control circuit 53 controls the data amplifier 64.

The data input/output terminal 14 is a terminal from which read data DQ is output and to which write data DQ is input, and connected to a data input/output circuit 100 (data control circuit). As shown in FIG. 1, the data input/output circuit 100 and the data amplifier 64 are connected to each other via the data bus 65. Accordingly, the data input/output circuit 100 outputs the read data supplied to the data input/output circuit 100 via the data bus 65, from the data input/output terminal 14. On the other hand, the write data supplied to the data input/output circuit 100 via the data input/output terminal 14 is supplied to the data amplifier 64 via the data bus 65. The data read/write control circuit controls the data input/output circuit 53. Control signals supplied to the data input/output circuit 100 from the read/write control circuit 53 include control signals S1 to S7.

The data input/output circuit 100 also performs a parallel-to-serial conversion and a serial-to-parallel conversion on input/output data. That is, the read data supplied from the data amplifier 64 via the data bus 65 is a parallel signal that is not converted into a serial signal yet. The data input/output circuit 100 converts the parallel read data on the data bus 65 into serial read data and supplies the serial read data to the data input/output terminal 14. On the other hand, the write data supplied from the data input/output terminal 14 is a serial signal. The data input/output circuit 100 converts the serial write data into parallel write data and supplies the parallel write data to the data bus 65.

Further, the semiconductor memory device 10 according to the present embodiment also includes a mode signal output circuit 200 that transmits mode signals set in the mode register 54 to the data bus 65. When an enable signal MRRE is activated, the mode signal output circuit 200 transmits mode signals M1 to M4 set in the mode register 54 to the data bus 65. The enable signal MRRE is a signal supplied from the read/write control circuit 53 when the internal command ICMD indicates "mode register read" (that is, when a mode register read command is input to the semiconductor memory device 10 from outside via the command terminal 12). When the enable signal MRRE is deactivated, an output from the mode signal output circuit 200 is in a high impedance state. In this case, therefore, the mode signal output circuit 200 has no influence on the data bus 65.

The above described aspects relate to an overall configuration of the semiconductor memory device 100. Circuit configurations of the data input/output circuit 100 and the mode signal output circuit 200 are described next.

Figure 2:
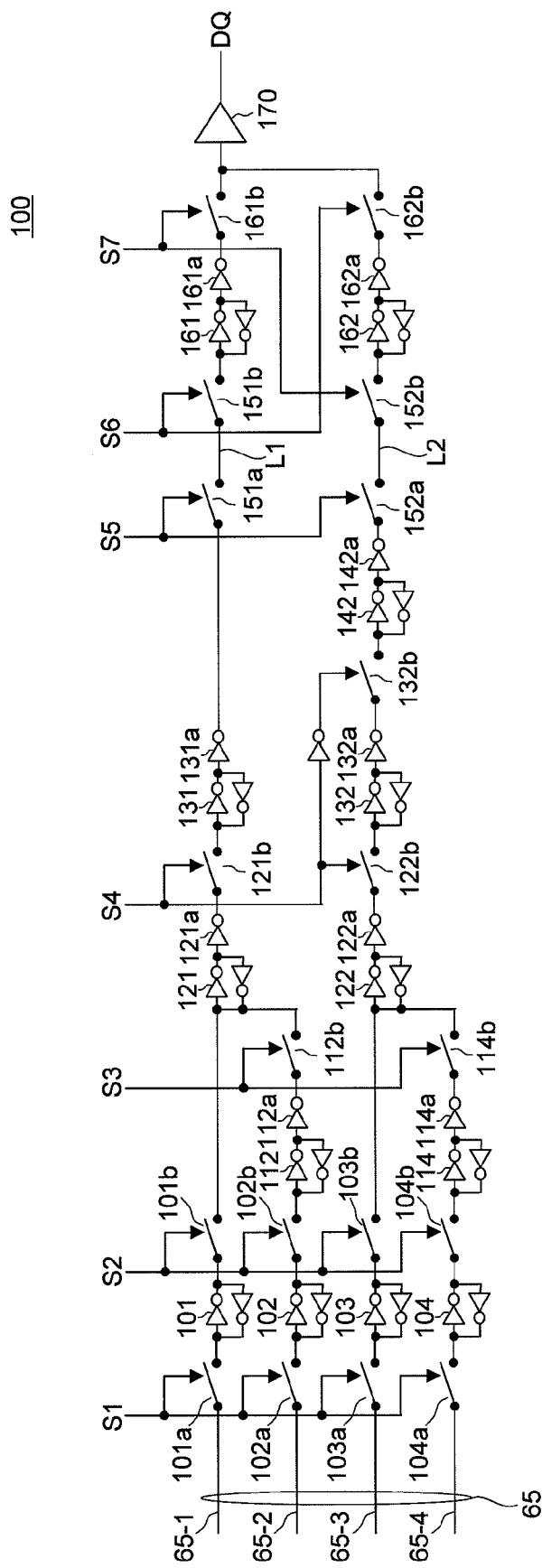
FIG. 2 is a circuit diagram of main parts of the data input/output circuit.

FIG. 2 is a circuit diagram of main parts of the data input/output circuit 100.

The main parts of the data input/output circuit 100 shown in FIG. 2 are circuit parts for converting parallel signals of four bits supplied via the data bus 65 into serial signals. That is, the example shown in FIG. 2 is an example of allocating four data buses 65-1 to 65-4 per I/O of one bit. However, the present invention is not limited thereto, and eight data buses 65 can be allocated per I/O of one bit.

As shown in FIG. 2, the data input/output circuit 100 includes four latch circuits 101 to 104 that latch signals supplied via the four data buses 65-1 to 65-4, respectively. Switches 101a to 104a controlled by the control signal S1 are provided in front of the latch circuits 101 to 104, respectively. Accordingly, when the control signal S1 is activated, the signals supplied via the four data buses 65-1 to 65-4 are input to the corresponding latch circuits 101 to 104, respectively. Switches 101b to 104b controlled by the control signal S2 are provided in rear of the latch circuits 101 to 104, respectively. Accordingly, when the control signal S2 is activated, the signals of four bits input to the latch circuits 101 to 104 are output from the switches 101b to 104b, respectively.

Outputs from the switches 101b and 103b are respectively supplied to latch circuits 121 and 122 as they are. By contrast, outputs from the switches 102b and 104b are supplied to latch circuits 112 and 114, and supplied to latch circuits 121 and 122 via inverters 112a and 114a and switches 112b and 114b, respectively. The switches 112b and 114b are controlled by the control signal S3. Therefore, by alternately activating the control signals S2 and S3, the signals of four bits supplied via the data buses 65-1 to 65-4 are converted into two signals each of two bits (two bits+two bits).

The signals fetched into the latch circuits 121 and 122 are supplied to latch circuits 131 and 132 via inverters 121a and 122a and switches 121b and 122b, respectively. The switches 121b and 122b are controlled by the control signal S4. Therefore, whenever the control signal S4 is activated, the signals of four bits supplied via the data buses 65-1 to 65-4 are input to the latch circuits 131 and 132 as two signals each of two bits, respectively.

An output from the latch circuit 131 is supplied to an interconnection L1 via an inverter 131a and a switch 151a. An output from the latch circuit 132 is, by contrast, temporarily input to a latch circuit 142 via an inverter 132a and a switch 132b and further supplied to an interconnection L2 via an inverter 142a and a switch 152a. The switch 132b is controlled by an inverted signal with respect to the control signal S4, and the switches 151a and 152a are controlled by the control signal S5.

The data on the interconnections L1 and L2 are fetched into latch circuits 161 and 162 via switches 151b and 152b, respectively. The signals fetched into the latch circuits 161 and 162 are supplied in common to an output buffer 170 via inverters 161*a* and 162*a* and switches 161*b* and 162*b*, respectively. The switches 151*b* and 162*b* are controlled by the control signal S6, and the switches 152*b* and 161*b* are controlled by the control signal S7. The control signals S6 and S7 are complementary signals to each other. Accordingly, the signals each of two bits on the interconnects L1 and L2 are converted into two signals each of one bit (one bit+one bit) and supplied to the output buffer 170.

In this way, the data input/output circuit 100 is capable of converting parallel signals of four bits supplied via the four data buses 65-1 to 65-4, respectively into serial signals and to output the serial signals.

Figure 3:
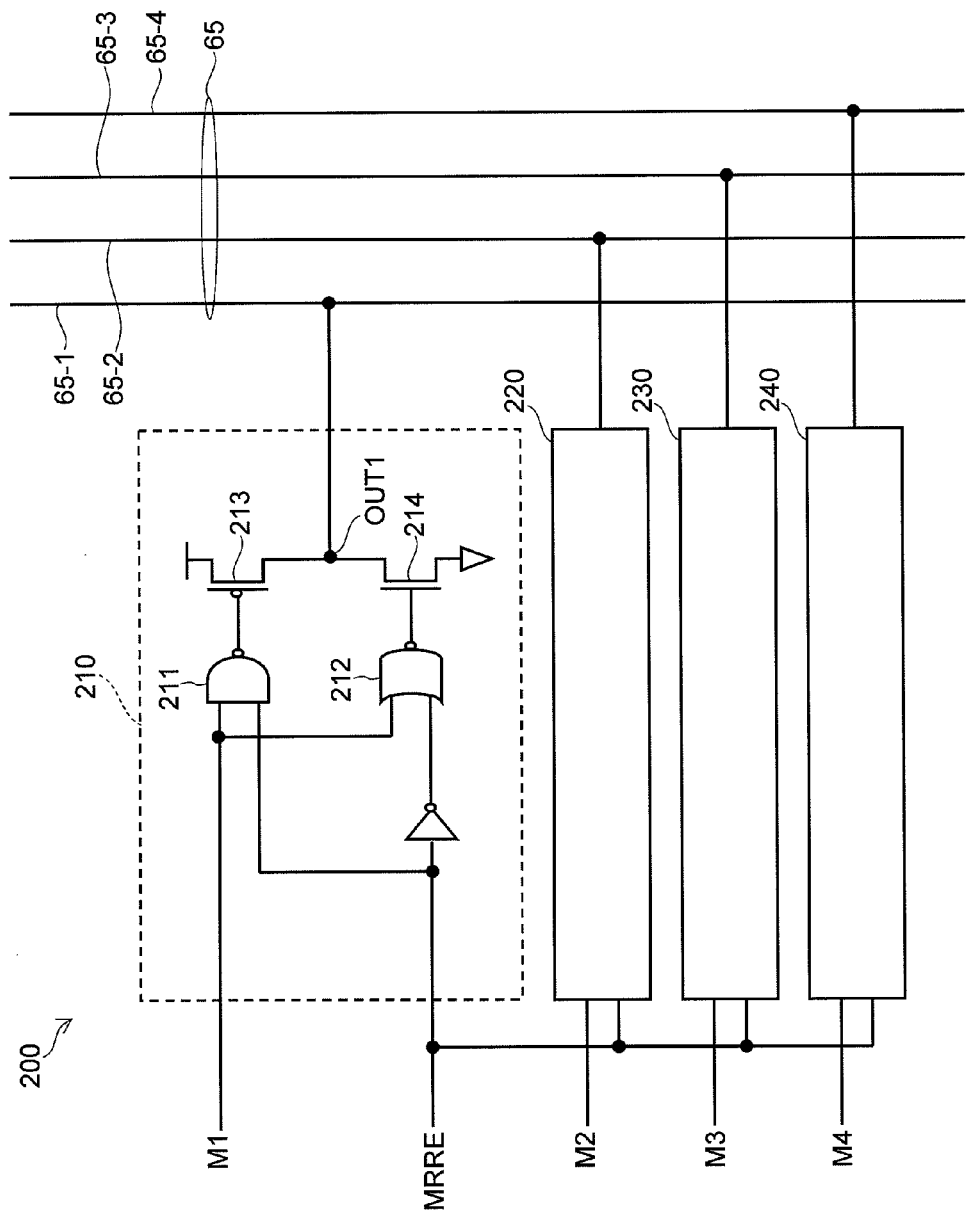
FIG. 3 is a circuit diagram of the mode signal output circuit.

FIG. 3 is a circuit diagram of the mode signal output circuit 200.

As shown in FIG. 3, the mode signal output circuit 200 is configured to include unit circuits 210, 220, 230, and 240 corresponding to the four data buses 65-1 to 65-4, respectively. The unit circuits 210, 220, 230, and 240 receive corresponding bits of the mode signals M1 to M4 and output the bits to the corresponding data buses 65-1 to 65-4, respectively. The unit circuits 210, 220, 230, and 240 are identical in a circuit configuration. FIG. 3 typically shows only a circuit configuration of the unit circuit 210. The circuit configuration of the unit circuit 210 is described below.

The unit circuit 210 has a so-called tri-state buffer configuration. Specifically, the unit circuit 210 includes a NAND circuit 211 receiving the mode signal M1 and the enable signal MRRE, a NOR circuit 212 receiving the mode signal M1 and an inverted signal with respect to the enable signal MRRE, and a P-channel MOS transistor 213 and an N-channel MOS transistor 214 that are connected in series. An output from the NAND circuit 211 is supplied to a gate of the transistor 213 and an output from the NOR circuit 212 is supplied to a gate of the transistor 214.

By configuring the unit circuit 210 as described above, when the enable signal MRRE is activated to a high level, a logical level of an output node OUT1 that is a connection point between the transistors 213 and 214 coincides with that of the mode signal M1. On the other hand, when the enable signal MRRE is deactivated to a low level, the output node OUT1 is in a high impedance state irrespectively of the logical level of the mode signal M1.

The structure that each of the output nodes OUT1 is connected to an associated one of the data buses 65-1 to 65-4 is taken from the inventors' investigation described below.

In order to output the mode signals M1 to M4 to outside, it is necessary to decide where to interrupt the mode signals M1 to M4 between sense amplifier 63 and data input/output terminal 14. If the mode signals M1 to M4 are supplied to the vicinity of the switches 161*b* and 162*b* for example, the mode signals M1 to M4 can be output to outside quickly because the mode signals M1 to M4 bypass many switches included in the data input/output circuit 100. In such a configuration, however, if the mode register read command is issued two clock cycles (that is minimum issuance cycle of the read command) after the read command was issued, a data collision between the read data and the mode signals M1 to M4 occurs. This is because the read data are delayed by the switches included in the data input/output circuit 100, while the mode signals M1 to M4 are not delayed by the switches.

In order to avoid the data collision, the mode register read command should be issued more than two clock cycles, four clock cycles for example, after the read command is issued. In this case, however, an operation speed of the semiconductor memory device is deteriorated. To achieve the high speed operation, it is desired that the mode register read command can be issued the same clock cycles as minimum issuance cycle of the read command. According to the present embodiment, the mode signals M1 to M4 are delayed as well as the read data by passing the switches included in the data input/output circuit 100. For this reason, each of the output nodes OUT1 is connected to an associated one of the data buses 65-1 to 65-4, thereby the read data and the mode signals M1 to M4 are transmitted in parallel in the data input/output circuit 100. Therefore, a high speed operation can be obtained without data collision.

Figure 4:
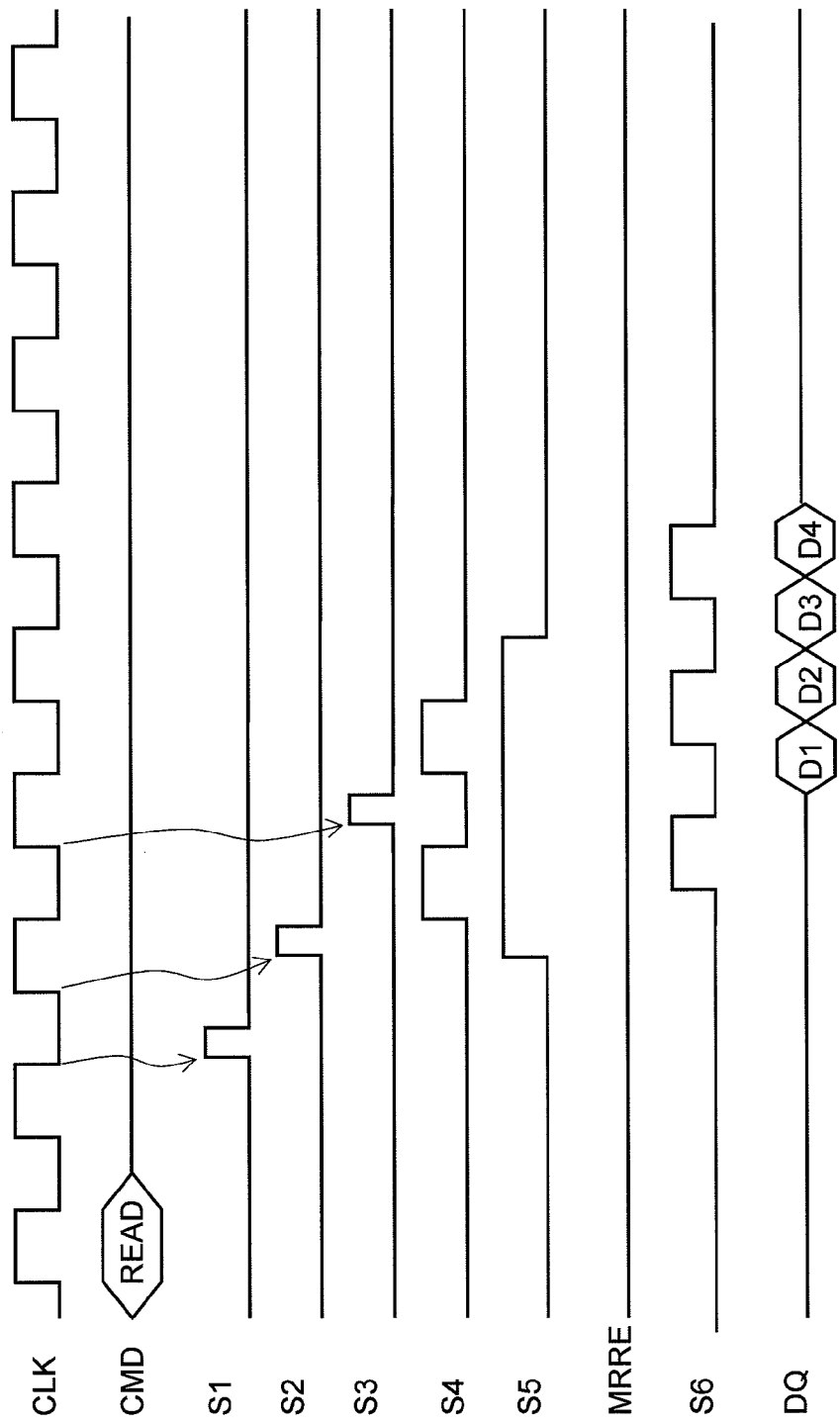
FIG. 4 is a timing diagram showing an operation when a normal read command is issued.

FIG. 4 is a timing diagram showing an operation when a normal read command is issued.

As shown in FIG. 4, when a read command (READ) is issued synchronously with the clock signal CLK, the control signal S1 is activated after a 1.5-clock cycle of read latency, and the control signals S2 and S3 are subsequently activated one after another. In an example shown in FIG. 4, the read latency is set as "3". Moreover, the control signal S4 is activated in response to transition of the control signals S2 and S3 from an active state to an inactive state, and the control signal S6 is activated synchronously with the control signal 4. In an interval in which the control signal S4 is activated twice, the control signal S5 is kept active.

Read data D1 to D4 of four bits supplied in parallel via the four data buses 65-1 to 65-4 is thereby converted into serial data by the data input/output circuit 100, and the serial data is output from the data input/output terminal 14 in series.

As shown in FIG. 4, when the normal read command is issued, the enable signal MRRE is kept a low level. Therefore, the mode signal output circuit 200 is completely disconnected from the data buses 65-1 to 65-4. Accordingly, the mode signal output circuit 200 has no influence at all on the data buses 65-1 to 65-4.

Figure 5:
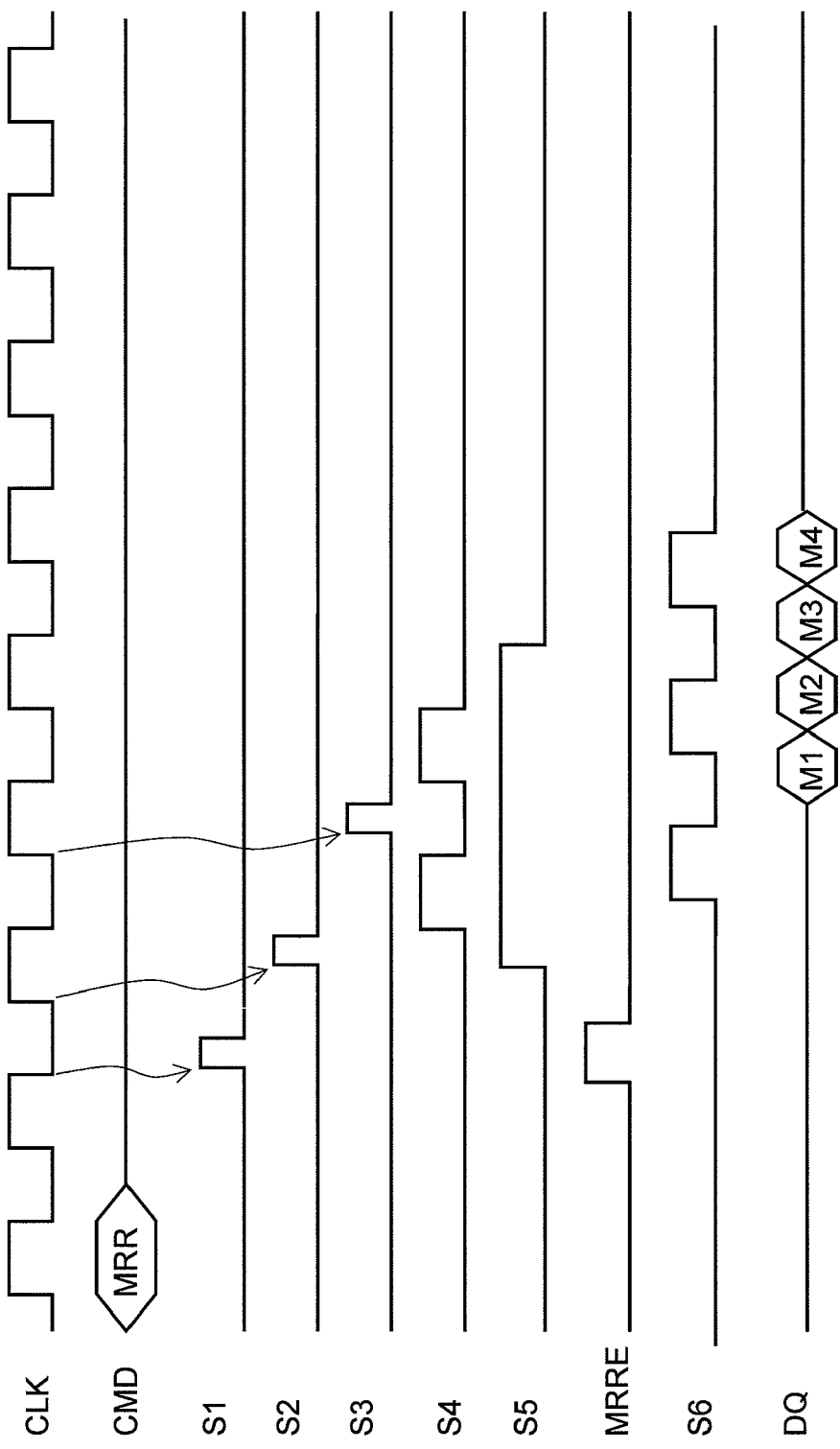
FIG. 5 is a timing diagram showing an operation when a mode register read command is issued.

FIG. 5 is a timing diagram showing an operation when a mode register read command is issued.

As shown in FIG. 5, when a mode register read command (MRR) is issued synchronously with the clock signal CLK, the semiconductor memory device 10 performs the same operation as that shown in FIG. 4 except that the enable signal MRRE is activated after the 1.5-clock cycle of the read latency. The enable signal MRRE is at a high level at least in an interval in which the control signal S1 is activated.

The mode signals M1 to M4 of four bits supplied in parallel via the four data buses 65-1 to 65-4, respectively, are thereby converted into serial signals by the data input/output circuit 100 and output in series from the data input/output terminal 14.

In this way, the operation performed by the data input/output circuit 100 when the mode register read command (MRR) is issued is the same as the operation when the normal read command (READ) is issued.

Figure 6:
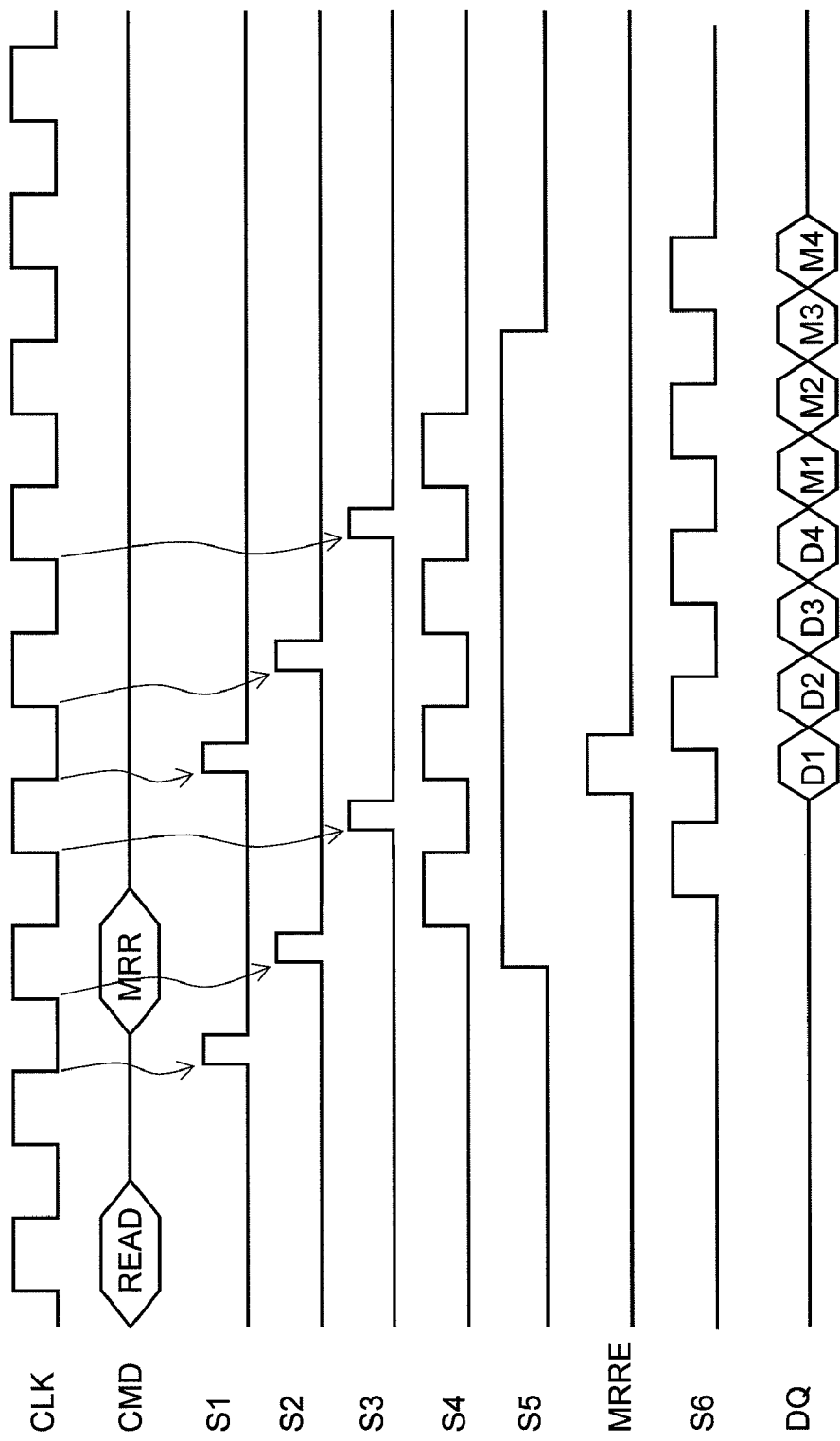
FIG. 6 is a timing diagram showing an operation when the read command and the mode register read command are continuously issued.

FIG. 6 is a timing diagram showing an operation when the read command and the mode register read command are continuously issued. An issuance interval from the read command to the mode register read command is a two-clock cycle and equal to a minimum issuance interval (CAS to CAS delay) of issuing column-system commands.

As described with reference to FIGS. 4 and 5, the operation performed when the read command (READ) is issued is basically the same as the operation performed when the mode register read command (MRR) is issued. Therefore, as shown in FIG. 6, when the read command (READ) and the mode register read command (MRR) are continuously issued, the data input/output circuit 100 operates similarly to that when normal read commands (READ) are continuously issued. That is, it suffices that the data input/output circuit 100 operates without discriminating whether an issued command is the read command (READ) or the mode register read command (MRR).

Accordingly, as shown in FIG. 6, after passage of the read latency (3 clocks) since the read command (READ) is issued, the read data D1 to D4 is output as a burst. After passage of the read latency (3 clocks) since the mode register read command (MRR) is issued, the mode signals M1 to M4 are output as a burst. In this way, latency from an input of the mode register read command (MRR) to an output of the mode signal M1 is equal to the read latency.

Figure 7:
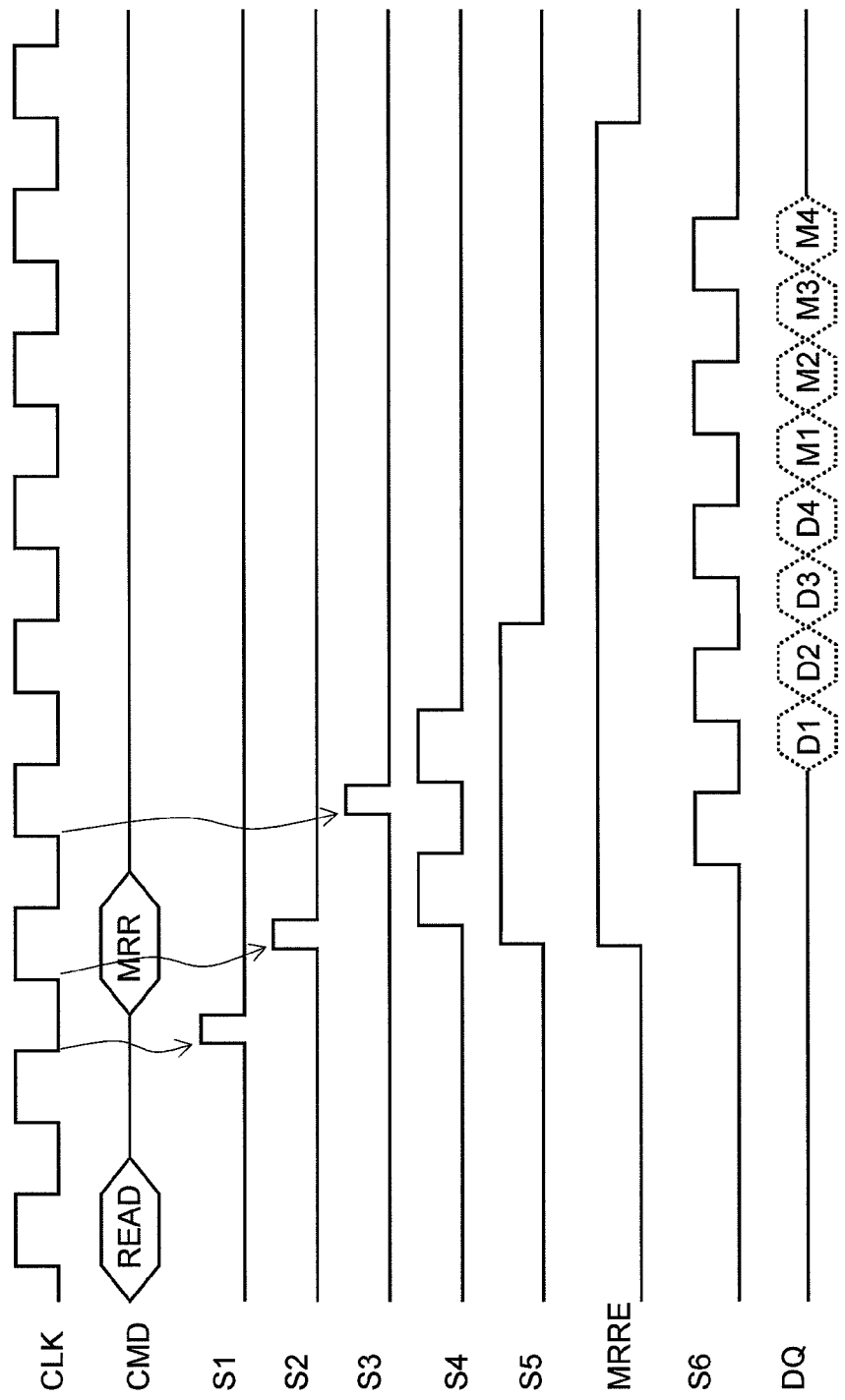
FIG. 7 is a timing diagram showing an operation performed by a semiconductor memory device according to a comparative example.

FIG. 7 is a timing diagram showing an operation performed by a semiconductor memory device according to a comparative example. Differently from the above embodiment, FIG. 7 shows an operation when mode signals read from a mode register 54 are supplied to interconnections L1 and L2 in a data input/output circuit 100.

As shown in FIG. 7, when the mode signals are caused to interrupt halfway along the data input/output circuit 100, the mode signals are supplied to the interconnections L1 and L2 by activation of the enable signal MRRE while read data is being supplied to the interconnections L1 and L2 by activation of a control signal S5. As a result, collision of the read data with the mode signals occurs on each of the interconnections L1 and L2 and neither the read data nor the mode signals can be output correctly. In FIG. 7, read data D1 to D4 and mode signals M1 to M4 are indicated by broken lines, respectively, and the broken lines mean that the read data D1 to D4 and the mode signals M1 to M4 are not output correctly due to data collision.

Besides, parallel signals of four bits are converted into two serial signals each of two bits (two bits+two bits) and these two-bit signals are supplied to the interconnections L1 and L2. Therefore, when the mode signals M1 to M4 are to be supplied to the interconnections L1 and L2, only the mode signals of two bits out of the mode signals M1 to M4 of four bits can be output per mode register read command.

In contrast, the semiconductor memory device 10 according to the present embodiment solves all of these problems. It is thereby possible for a controller that controls the semiconductor memory device 10 to handle the mode register read command similarly to the normal read command, and it is also possible to read the mode signals M1 to M4 of four bits per mode register read command.

Although in the above described embodiment the mode signals M1 to M4 are output via a signal data input/output terminal 14, many actual devices employ plural data input/output terminals. The semiconductor memory device of another embodiment employing plural data input/output terminals DQ0 to DQ31 are shown in FIG. 8.

Figure 8:
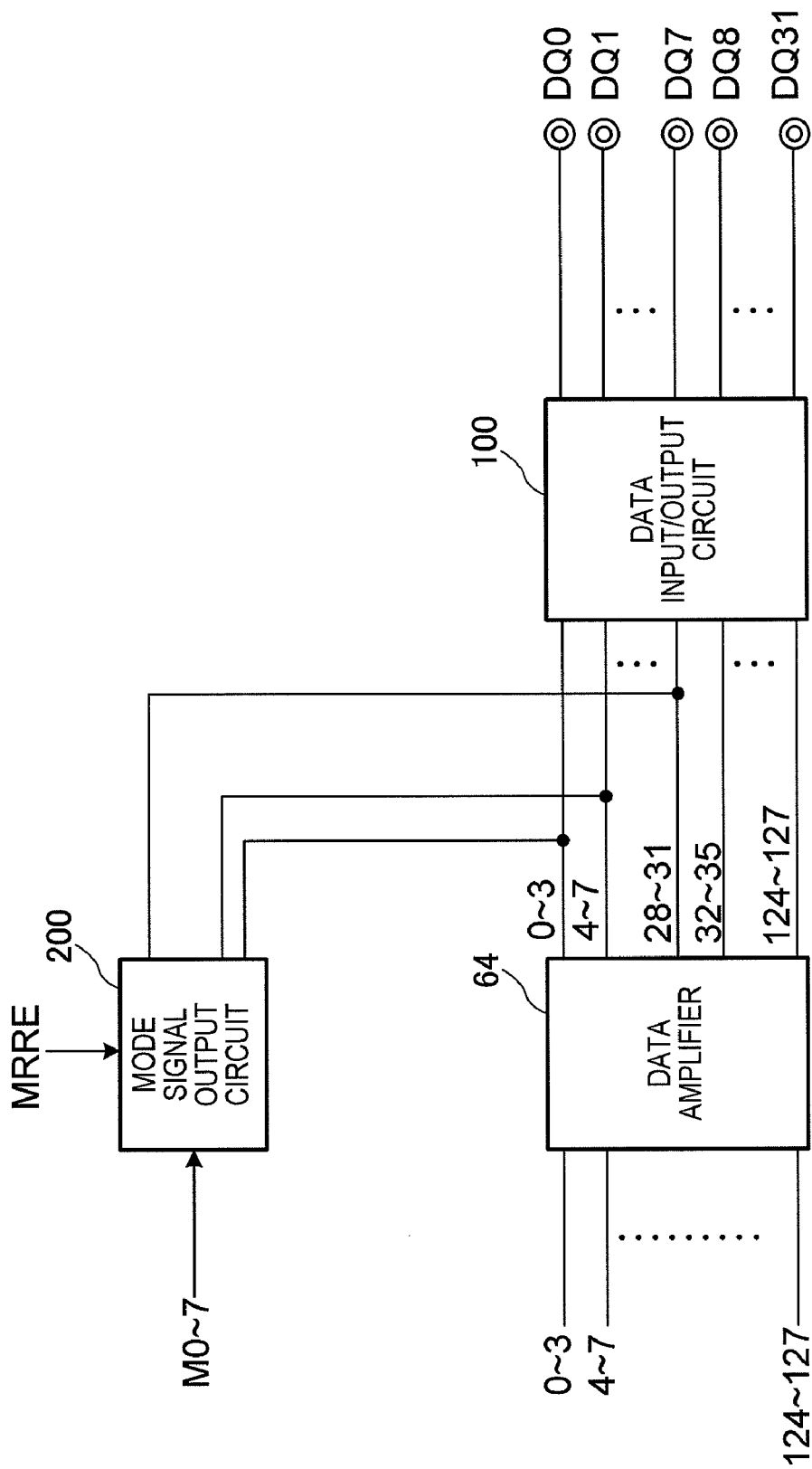
FIG. 8 is a block diagram showing a configuration of a semiconductor memory device according to another embodiment of the present invention.
Figure 9:
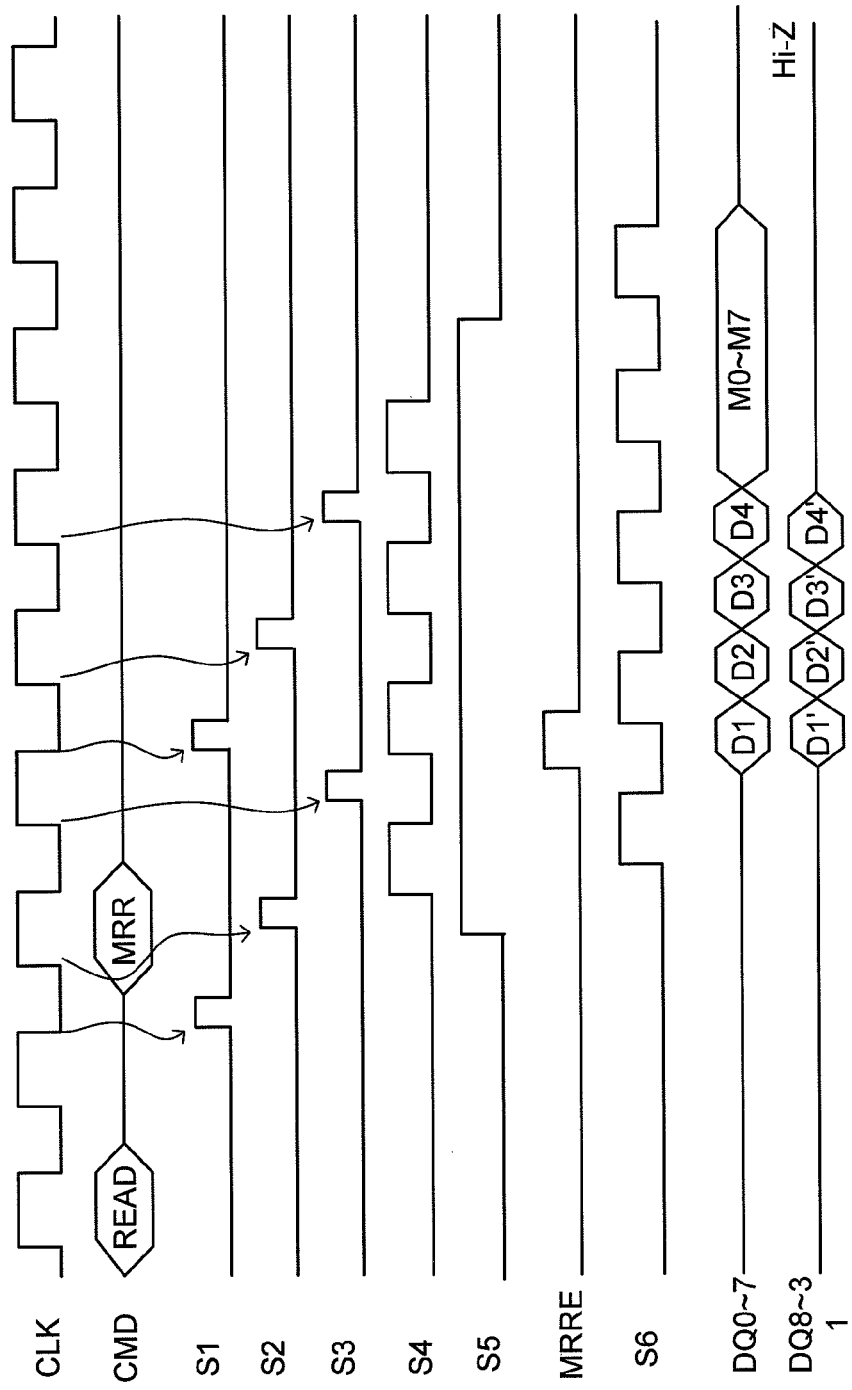
FIG. 9 is a timing diagram showing an operation when the read command and the mode register read command are continuously issued.

As shown in FIG. 8, the semiconductor memory device of the present embodiment is a DRAM employing 32 data input/output terminals. Of course the invention is not limited to a DRAM but can be applied to other memory device having a mode register or other type of IC than memory device. The mode register can store other information than operation mode such as product information.

The semiconductor memory device can burst output four bits per one data input/output terminal DQ0 to DQ31 in response to the read command by four bit prefetch operation. The data amplifier 64 amplifies 128-bits data and supplies them to the data input/output circuit 100 (data control circuit) via data buses 0-127.

The mode register stores 8-bits data M0 to M7. The mode signal M0 are supplied in common to data buses 0-3, and the mode signal M1 are supplied in common to data buses 4-7.

Similarly the mode signal M7 are supplied in common to data buses 28-31. The remaining data buses 32-127 are not used to output the mode signals.

According to the present embodiment, the data input/output terminals DQ0 to DQ7 are used to output either the read data or the mode signals while the data input/output terminal DQ8 to DQ31 are used to output the read data but not used to output the mode signals.

It is apparent that the present invention is not limited to the above embodiments, but may be modified and changed without departing from the scope and spirit of the invention.

What is claimed is:

1. A semiconductor device comprising:
a memory circuit producing in a first mode a set of first data and a set of second data in parallel to each other;
a mode register producing third data in a second mode;
a first data bus coupled to the memory circuit to receive the set of first data in the first mode and to the mode register to receive the third data in the second mode;
a second data bus coupled to the memory circuit to receive the set of the second data in the first mode and the second data bus being disconnected from the mode register;
third and fourth data buses;
a first data control circuit provided between the first data bus and the third data bus to perform a parallel to serial conversion operation on data on the first data bus and output fourth data onto the third data bus;
a second data control circuit provided between the second data bus and the fourth bus to perform a parallel to serial conversion operation on data on the second data bus and output fifth data onto the fourth data bus;
a first output buffer coupled to the third data bus to output externally the fourth data; and
a second output buffer coupled to the fourth data bus to output externally the fifth data.

2. The semiconductor device as claimed in claim 1, wherein the first data bus receives the third data in common in the second mode.

3. The semiconductor device as claimed in claim 1, wherein the third data comprises mode data which indicates an operation mode of the semiconductor device.

4. A semiconductor device comprising:
a memory circuit producing in a first mode a set of first data in parallel;
a mode register producing second data in a second mode;
a local data bus coupled to the memory circuit to receive the set of first data in the first mode and to the mode register to receive the second data in the second mode;
a main data bus;
a data control circuit provided between the local data bus and the main data bus to perform a parallel to serial conversion operation on data on the local data bus and output third data onto the main data bus; and
an output buffer coupled to the main data bus to output externally the third data.

5. The semiconductor device as claimed in claim 4, wherein the local data bus receives the second data in common in the second mode.

6. The semiconductor device as claimed in claim 4, wherein the second data comprises mode data which indicates an operation mode of the semiconductor device.

7. A semiconductor device comprising:
a memory circuit configured to produce in a first mode a set of first data in parallel;
a mode register configured to produce second data in a second mode;

a local data bus coupled to the memory circuit to receive the set of the first data in the first mode and to the mode register to receive the second data in the second mode;

a main data bus;

a data control circuit provided between the local data bus and the main data bus to perform a parallel to serial conversion operation on data on the local data bus and output third data onto the main data bus; and an output buffer coupled to the main data bus to output externally the third data.

8. The semiconductor device as claimed in claim 7, wherein the main data bus comprises a plurality of main data lines, each of the main data lines transferring corresponding ones of the third data in the first mode.

9. The semiconductor device as claimed in claim 8, wherein at least one of the main data lines of the main data bus transfers the third data and the others of the main data lines of the main data bus maintain high-impedance.

10. The semiconductor device as claimed in claim 7, wherein the local data bus comprises a plurality of local data lines and the main data bus comprises a plurality of main data lines, the local data lines being greater in number than the main data lines.

* * * * *